(12) United States Patent
Shao et al.

(10) Patent No.: US 8,237,902 B2
(45) Date of Patent: Aug. 7, 2012

(54) ARRAY SUBSTRATE OF LCD WITH WIDE VIEWING ANGLE AND METHOD FOR MANUFACTURING THE SAME

(75) Inventors: Xibin Shao, Beijing (CN); Haijun Yin, Beijing (CN); Junrui Zhang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 329 days.

(21) Appl. No.: 12/557,312

(22) Filed: Sep. 10, 2009

(65) Prior Publication Data

US 2010/0110323 A1      May 6, 2010

(30) Foreign Application Priority Data

Nov. 5, 2008    (CN) .......................... 2008 1 0225910

(51) Int. Cl.
*G02F 1/1337* (2006.01)
*G02F 1/136* (2006.01)
*G02F 1/13* (2006.01)
(52) U.S. Cl. ........................... 349/129; 349/187; 349/43
(58) Field of Classification Search ................... 349/129
See application file for complete search history.

(56) References Cited

U.S. PATENT DOCUMENTS 6,642,983 B2 * 11/2003 Chen et al. ..................... 349/129
7,177,000 B2 *  2/2007 Hu et al. ........................ 349/122

* cited by examiner

*Primary Examiner* — Wen-Ying P Chen
(74) *Attorney, Agent, or Firm* — Ladas & Parry LLP

(57) ABSTRACT

The present invention relates to an array substrate of an LCD with a wide viewing angle and a method for manufacturing the same. The array substrate includes: gate lines and data lines formed on a substrate, and TFTs and pixel electrodes formed in pixel areas defined by the gate lines and the data lines, wherein at least one shaft for inducing liquid crystal to form a multi-domain structure is formed on each of the pixel electrodes. The method includes: forming a pattern containing gate lines, gate electrodes, data lines, source electrodes, drain electrodes and TFT channels on a substrate; depositing a passivation layer, opening a first via hole for connecting each of the drain electrodes to each of pixel electrodes and a second via hole for forming a shaft; and depositing a transparent conductive film, forming a pattern containing the pixel electrodes within pixel areas, and forming a shaft at the second via hole for inducing liquid crystal to form a multi-domain structure. The present invention uses a shaft structure to induce liquid crystal to form a multi-domain structure, which not only realizes a symmetric wide viewing angle, but also simplifies the structure and manufacturing process of an array substrate.

12 Claims, 7 Drawing Sheets

A5 - A5

B5 - B5

ARRAY SUBSTRATE OF LCD WITH WIDE VIEWING ANGLE AND METHOD FOR MANUFACTURING THE SAME

CROSS-REFERENCE TO RELATED APPLICATIONS

This application claims priority to Chinese Patent Application No. 200810225910.4, filed on Nov. 5, 2008, entitled "Array Substrate of LCD with Wide Viewing Angle and Method for Manufacturing the Same", which is incorporated herein by reference in its entirety

FIELD OF THE TECHNOLOGY

The present invention relates to a liquid crystal display (LCD) and a method for manufacturing the same, especially to a wide viewing angle LCD array substrate and a method for manufacturing the same.

BACKGROUND

With rapid growing of LCD market and increasingly expansion of application fields, especially the application field of large-size LCD, an LCD needs to have a wide range of viewing angle.

LCD includes an array substrate and a color substrate which are disposed as a cell. Liquid crystal is disposed between the two substrates. Under effect of voltage, the liquid crystal deflects. The deflection degree may be controlled by adjusting the voltage so as to achieve the purpose of modulating transmittance (gray scale display).

As the defect that the existing LCD has a too narrow viewing angle, many display modes are proposed in prior art to overcome this defect such as 90° twisted nematic+film (TN+film) mode, multi-domain vertical alignment (MVA) mode, pixel electrode patterned vertical alignment (PVA) mode, in-plane switching (IPS) mode, and fringe field switching (FFS) mode.

Although the above-mentioned display modes are proposed successively and industrialized gradually, the above display modes still have defects respectively during actual implementation. The improvement to the viewing angle of the TN+film mode is limited to a scope of horizontal 140° and vertical 100°. Therefore, the TN+film mode is usually used for a monitor of a laptop computer or a desktop computer but is not suitable for a large-size LCD TV. The MVA mode needs a complicated convex structure manufactured on one side of the color substrate (color filter) which increases manufacturing cost. The PVA mode needs to manufacture the pixel electrode to a complicated slit structure which influences use efficiency of light. The IPS mode and the FFS mode require high precision of control process which causes difficult manufacturing process.

SUMMARY

The subject of the present invention is to provide an array substrate of an LCD with a wide viewing angle and a method for manufacturing the same. The array substrate has characteristics of symmetric wide viewing angle. At the same time, the array substrate structure and the manufacturing method are also simplified.

In order to realize the above subject, the present invention provides an array substrate of an LCD with a wide viewing angle. The array substrate includes gate lines and data lines formed on a substrate, and TFTs and pixel electrodes formed in pixel areas defined by the gate lines and the data lines, wherein at least one shaft for inducing liquid crystal to form a multi-domain structure is formed on each of the pixel electrodes.

Each of the TFTs includes a gate electrode, a gate insulating layer, a semiconductor layer, a doped semiconductor layer, a source electrode, a drain electrode, a TFT channel and a passivation layer; the passivation layer is formed on the source electrode, the drain electrode and the TFT channel; and a first via hole for connecting each of the pixel electrodes to the drain electrode and a second via hole with a slope-shaped sidewall to form the shaft are opened on the passivation layer.

The passivation layer and the gate insulating layer within the second via hole are completely etched off; each of the pixel electrodes covers the second via hole to form a funnel-shaped shaft with a smaller bottom area and a larger top area and for inducing the liquid crystal to form the multi-domain structure.

Based on the above-mentioned technical solution, a top view shape of the shaft is of square, rectangle, polygon, round, oval, or strip; an angle between the sidewall of the shaft and a horizontal plane is 15°-85°.

In order to realize the above subject, the present invention further provides a method for manufacturing an array substrate of an LCD with a wide viewing angle. The method includes:

Step 1, forming a pattern containing gate lines, gate electrodes, data lines, source electrodes, drain electrodes and thin film transistor (TFT) channels on a substrate;

Step 2, depositing a passivation layer on the substrate after finishing the step 1, and opening a first via hole for connecting each of the drain electrodes to each of the pixel electrodes and a second via hole for forming a shaft by a patterning process on the passivation layer; and Step 3, depositing a layer of a transparent conductive film on the substrate after finishing the step 2, forming a pattern containing the pixel electrodes by a patterning process within pixel areas, and forming a shaft at the second via hole for inducing liquid crystal to form a multi-domain structure.

The step 2 specifically includes: depositing the passivation layer on the substrate after finishing the step 1, opening the first via hole and at least one second via hole on the passivation layer by using a common mask in a patterning process; and the first via hole is located at each of the drain electrodes, the passivation layer within the first via hole is completely etched off, a sidewall of the at least one second via hole is slope-shaped, and the passivation layer and the gate insulating layer within the second via hole are completely etched off Furthermore, a top view shape of the second via hole is of square, rectangle, polygon, round, oval, or strip; an angle between the sidewall of the second via hole and a horizontal plane is 15°-85°.

The present invention provides a method for manufacturing an array substrate of an LCD with a wide viewing angle. At least one shaft with slope-shaped sidewall is formed within each pixel area, which induces liquid crystal to form a multi-domain structure so as to realize a display mode of novel multi-domain vertical alignment. The display mode uses negative liquid crystal. Under the status of power off, the liquid crystal outside the area of each shaft is aligned vertically under the effect of alignment material while an alignment defect happens at the area of each shaft. Under the status of power on, the alignment of the liquid crystal at the area of each shaft induces the liquid crystal at surrounding area to form a multi-domain structure so as to realize a wide viewing angle which is also symmetric. Furthermore, on the precondition of ensuring the characteristics of the wide viewing angle, as the technical solution of the present invention needs neither a convex structure at the color substrate side nor a rubbing process, the present invention simplifies the structure and the manufacturing process of the array substrate, and the manufacturing process can be compatible with that of a conventional TN-type TFT-LCD. During practical application, the viewing angle may be further broadened by using a negative birefringence compensation film inside of a polarizer. The array substrate of an LCD with a wide viewing angle in accordance with the present invention may be used in an LCD in various driving modes such as frame inversion, line inversion, column inversion, and point inversion so as to have a widespread application prospect.

EXPLANATION OF FIGURE MARKS

| 1 substrate | 2 gate line | 3 gate electrode |
|---|---|---|
| 4 common electrode line | 5 gate insulating layer | 6 semiconductor layer |
| 7 doped semiconductor layer | 8 source electrode | 9 drain electrode |
| 10 data line | 11 passivation layer | 12 first via hole |
| 13 second via hole | 14 pixel electrode | 15 shaft |
| 20 array substrate | 30 color substrate | 31 color filter |
| 32 common electrode | 40 liquid crystal | |

DETAILED DESCRIPTION

The present invention will be described in more detail with reference to the drawings and embodiments.

Figure 1:
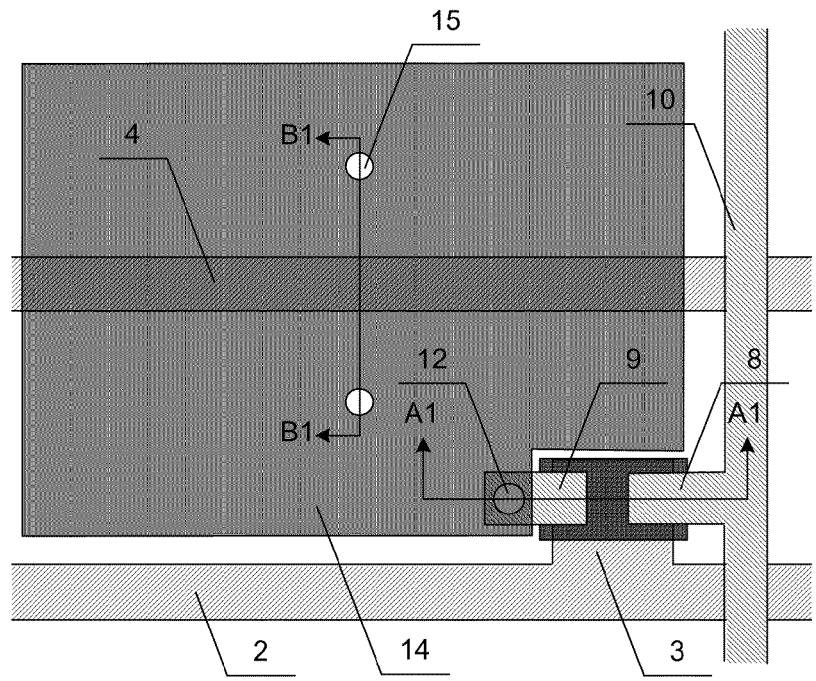
FIG. 1 is a structural schematic view illustrating the array substrate of an LCD with a wide viewing angle in accordance with the present invention.
Figure 2:
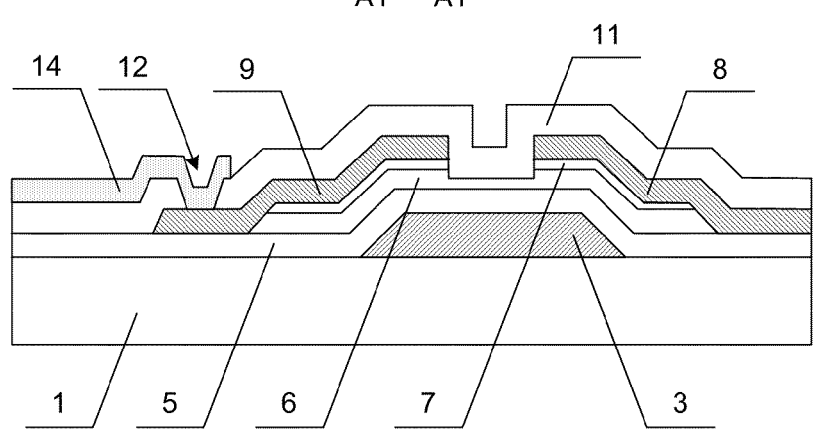
FIG. 2 is a cross-section view along the direction of A1-A1 in FIG. 1.
Figure 3:
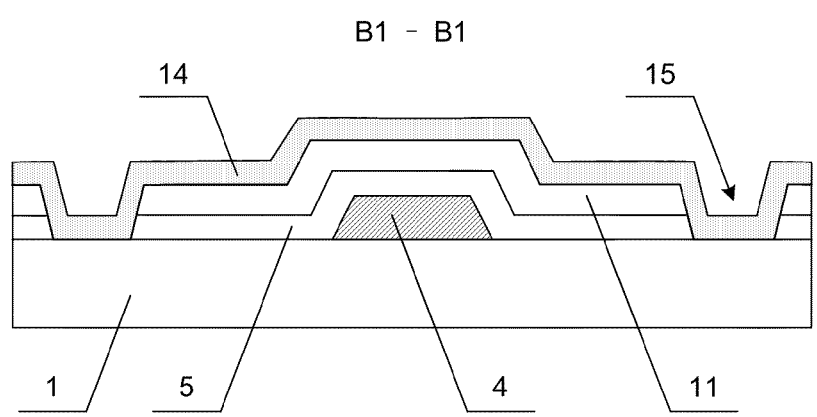
FIG. 3 is a cross-section view along the direction of B1-B1 in FIG. 1.

FIG. 1 is a structural schematic view illustrating the array substrate of an LCD with a wide viewing angle in accordance with the present invention. FIG. 2 is a cross-section view along the direction of A1-A1 in FIG. 1. FIG. 3 is a cross-section view along the direction of B1-B1 in FIG. 1. As shown in FIGS. 1-3, the main structure of the array substrate of the LCD with a wide viewing angle in accordance with the present invention includes gate lines 2, data lines 10, pixel electrodes 14 and thin film transistors (TFTs). The gate lines 2 together with the data lines 10 form pixel areas. A TFT is formed at an intersect position of a gate line 2 and a data line 10, a pixel electrode 14 is formed within a pixel area, and shafts 15 are also formed within each pixel area. At least one sidewall of each shaft 15 is slope-shaped. Specifically, each shaft 15 in which a passivation layer and a gate insulating layer are completely etched off is a funnel-shaped structure with a smaller bottom area and a larger top area. Under the status of power off, the liquid crystal at shaft area has an alignment defect. Under the status of power on, the alignment of the liquid crystal at the shaft area induces the liquid crystal at surrounding area to form a multi-domain structure.

In the above technical solution of the present invention, there may be one or more shafts 15. The top view shape of each shaft 15 may be formed to square, rectangle, polygon, round, oval, strip, or other shapes commonly used by people skilled in this art according to requirements for forming a multi-domain structure. Preferably, under a condition of area equally, each shaft 15 uses a top view shape with long circumference. When there is only one shaft 15, the shaft 15 is preferably located at the central area of each pixel area. When there are multiple shafts 15, they may be evenly distributed within each pixel area. The number of shafts 15 may be determined according to the size of each pixel area. Generally speaking, for a pixel area about 50 μm×150 μm, there may be disposed one shaft 15 greater than or equal to 9 μm² (such as 9 μm²-400 μm²). An angle between the sidewall of the shaft 15 and the horizontal plane is 15°-85°. Obviously, the characteristic of wide viewing angle can be further improved by increasing the number of shafts 15.

In the above technical solution of the present invention, a common electrode line (or, storage capacitor line) 4 may be further formed in a pixel area, which is located between two gate lines 2 and is adapted to form a storage capacitor together with the pixel electrode 14. When the common electrode line 4 is located at middle of each pixel area, at least two shafts 15 according to the present invention may be formed within each pixel area, which are respectively disposed between gate lines 2 and the common electrode line 4. In the technical solution of the present invention, the depth of each shaft may be equal to the total thickness of the gate insulating layer and the passivation layer, that is, the passivation layer and gate insulating layer in each shaft are completely etched off to expose the substrate. Alternatively, the depth of each shaft may also be equal to the thickness of the passivation layer, that is, the passivation layer in each shaft is completely etched off to expose the gate insulating layer. Certainly, the depth of each shaft may also be between those of the above two situations.

In the above technical solution of the present invention, the TFT has the same structure as that of an existing TFT structure of TN-type TFT-LCD, which includes a gate electrode 3, a gate insulating layer 5, an active layer (including a semiconductor layer 6 and a doped semiconductor layer 7), a source electrode 8, a drain electrode 9, a TFT channel, and a passivation layer 11. The total thickness of the gate insulating layer 5 and the passivation layer 11 is 0.5 µm-5 µm, which is greater than or equal to the total thickness of the gate insulating layer and the passivation layer of an existing TN-type or MVA-type TFT-LCD. The gate electrode 3 is formed on the substrate 1 and is connected with the gate line 2. The gate insulating layer 5 is formed on the gate line 2 and the gate electrode 3 and covers the whole substrate 1. The active layer is formed on the gate insulating layer 5 and is located over the gate electrode 3. One end of the source electrode 8 is located on the active layer, and the other end is connected with the data line 10. One end of the drain electrode 9 is located on the active layer, and the other end is connected with the pixel electrode 14 via the first via hole 12. The TFT channel is formed between the source electrode 8 and the drain electrode 9. The passivation layer 11 is formed on the TFT channel and covers the whole substrate 1. A first via hole 12 for connecting the pixel electrode 14 to the drain electrode 9 is opened on the passivation layer 11. At the same time, at least one second via hole 13 is opened within each pixel area, the sidewall of which is slope-shaped. The pixel electrode 14 is formed within each pixel area, which is on one hand connected with the drain electrode 9 via the first via hole 12 and is on the other hand provided with a shaft 15 at the each second via hole 13. The sidewall of each shaft 15 is slope-shaped for inducing liquid crystal to form a multi-domain structure.

FIGS. 4-15 are schematic view illustrating the manufacturing procedure of the array substrate of an LCD with a wide viewing angle in accordance with the present invention. The manufacturing procedure of the array substrate of an LCD with a wide viewing angle will be explained by taking a 5-times patterning process as an example as follows. In the following explanation of the present invention, the patterning process includes: photoresist coating, masking, exposure, etching, stripping and so on. The photoresist is explained by taking positive photoresist as an example.

Figure 4:
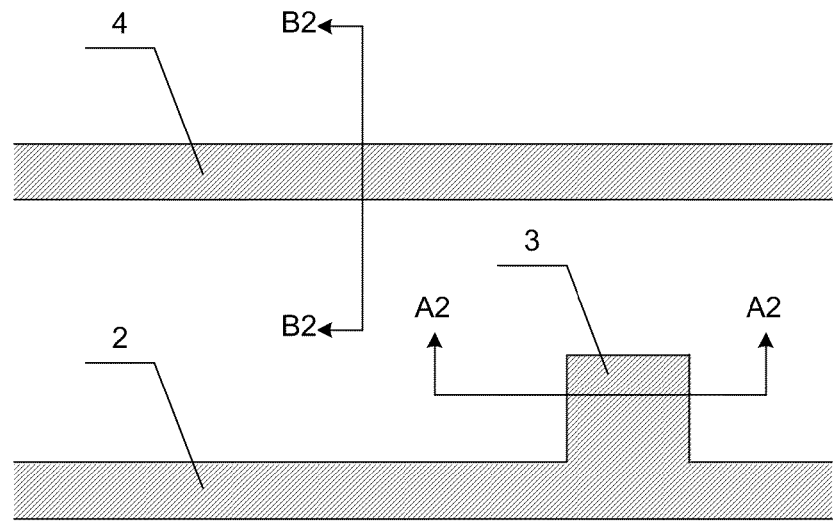
FIG. 4 is a flat view illustrating the array substrate of the LCD with a wide viewing angle after undergoing the first patterning process in accordance with the present invention.
Figure 5:
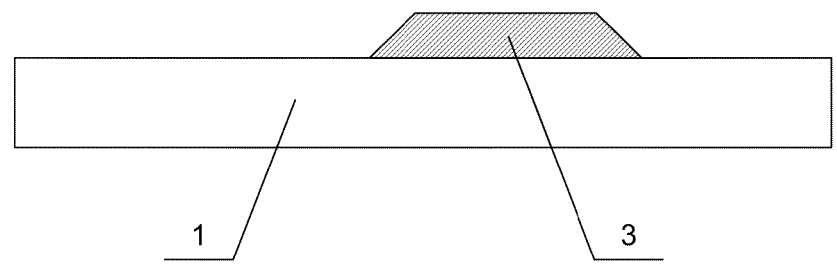
FIG. 5 is a cross-section view along the direction of A2-A2 in FIG. 4.
Figure 6:
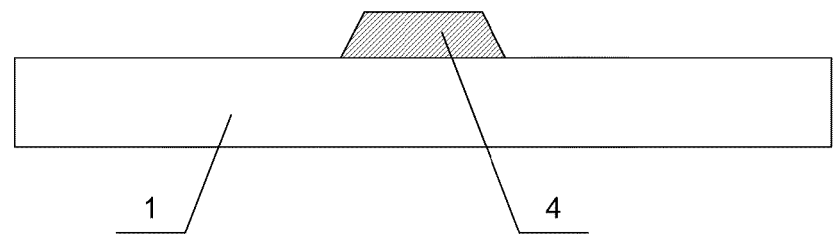
FIG. 6 is a cross-section view along the direction of B2-B2 in FIG. 4.

FIG. 4 is a flat view illustrating the array substrate of the LCD with a wide viewing angle after undergoing the first patterning process in accordance with the present invention. FIG. 5 is a cross-section view along the direction of A2-A2 in FIG. 4. FIG. 6 is a cross-section view along the direction of B2-B2 in FIG. 4. A layer of gate metal film is deposited on a substrate 1 (such as a glass substrate or a quartz substrate) by using a method of magnetron sputtering or thermal evaporation. As shown in FIGS. 4-6, the gate metal film is patterned by using a common mask in the first patterning process, and a pattern contains gate lines 2 and gate electrodes 3 on a certain area of the substrate 1. In practical application, common electrode lines 4 may be formed in this patterning process at the same time. Each common electrode line 4 is located between two adjacent gate lines 2, parallel to the gate lines 2 and located in the middle of each pixel area, which is adapted to form a storage capacitor together with the pixel electrode to form a structure that the storage capacitor is on the common electrode line (Cs on Common).

Figure 7:
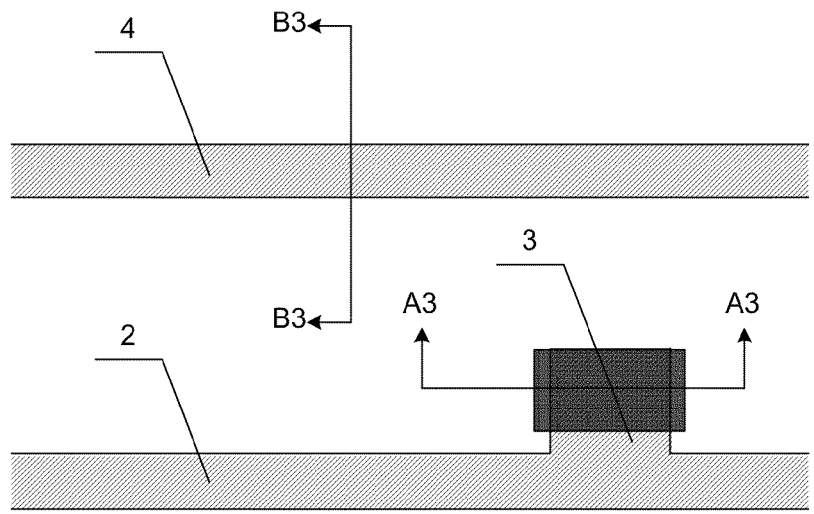
FIG. 7 is a flat view illustrating the array substrate of an LCD with a wide viewing angle after undergoing the second patterning process in accordance with the present invention.
Figure 8:
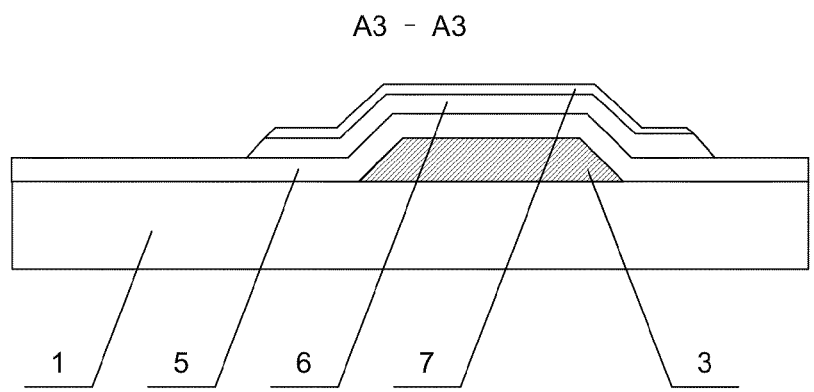
FIG. 8 is a cross-section view along the direction of A3-A3 in FIG. 7.
Figure 9:
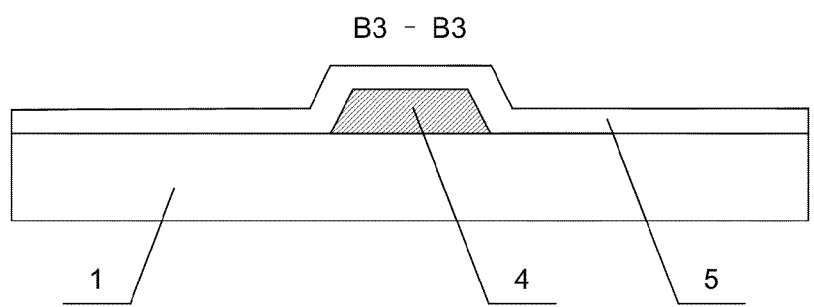
FIG. 9 is a cross-section view along the direction of B3-B3 in FIG. 7.

FIG. 7 is a flat view illustrating the array substrate of an LCD with a wide viewing angle after undergoing the second patterning process in accordance with the present invention. FIG. 8 is a cross-section view along the direction of A3-A3 in FIG. 7. FIG. 9 is a cross-section view along the direction of B3-B3 in FIG. 7. A gate insulating layer 5, a semiconductor layer 6, and a doped semiconductor layer (ohmic contact layer) 7 may be deposited in sequence on the substrate by using a method of plasma enhanced chemical vapor deposition (PECVD) after finishing the above patterning. The gate insulating layer 5 may uses SiNx, SiOx or SiOxNy. As shown in FIGS. 7-9, the semiconductor layer 6 and the doped semiconductor layer 7 may be patterned by using a common mask in the second patterning process, and a pattern containing an active layer is formed on the gate electrode 3. The active layer includes the semiconductor layer 6 and the doped semiconductor layer 7.

Figure 10:
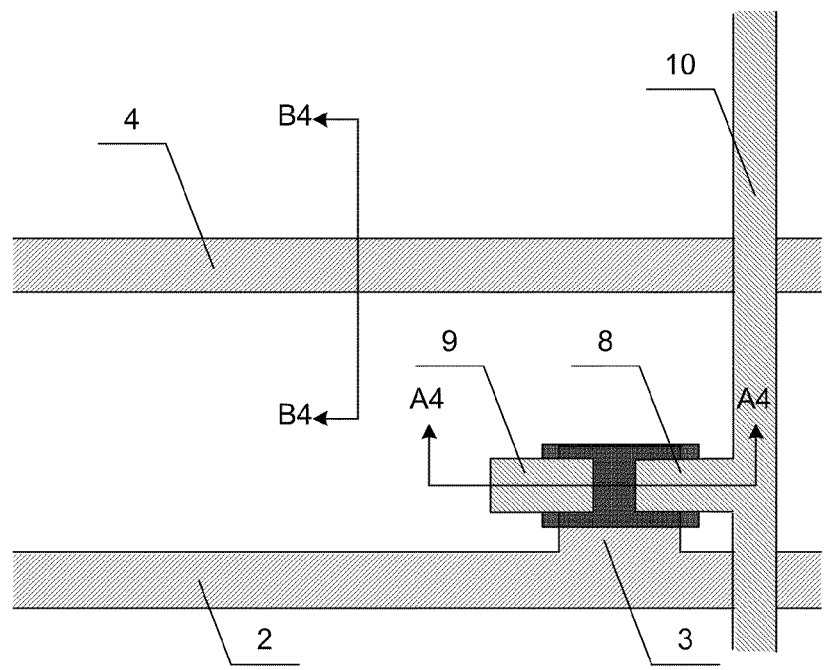
FIG. 10 is a flat view illustrating the array substrate of an LCD with a wide viewing angle after undergoing the third patterning process in accordance with the present invention.
Figure 11:
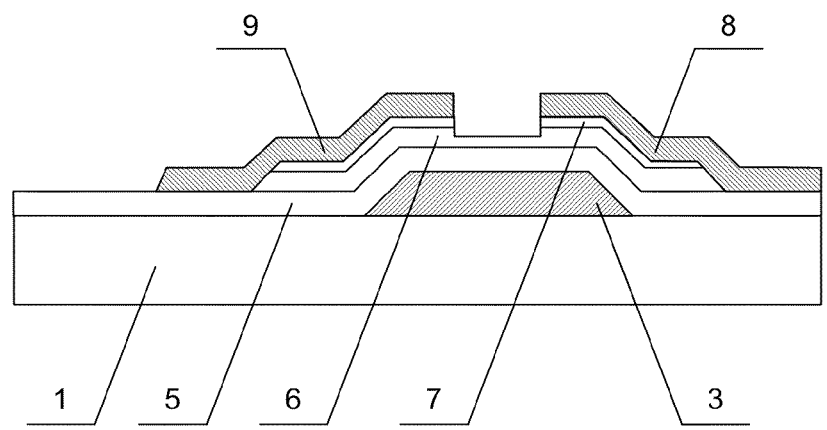
FIG. 11 is a cross-section view along the direction of A4-A4 in FIG. 10.
Figure 12:
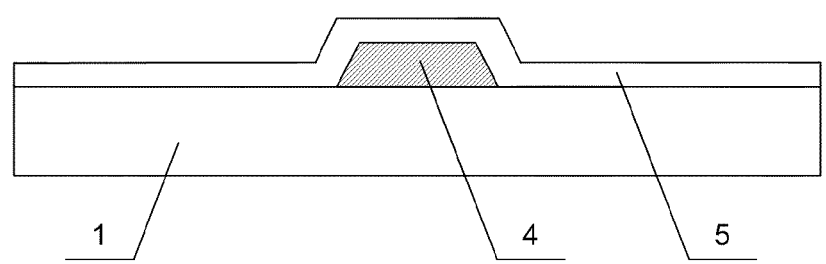
FIG. 12 is a cross-section view along the direction of B4-B4 in FIG. 10.

FIG. 10 is a flat view illustrating the array substrate of an LCD with a wide viewing angle after undergoing the third patterning process in accordance with the present invention. FIG. 11 is a cross-section view along the direction of A4-A4 in FIG. 10. FIG. 12 is a cross-section view along the direction of B4-B4 in FIG. 10. A layer of source-drain metal film is deposited on the substrate by using a method of magnetron sputtering or thermal evaporation after finishing the above patterning. As shown in FIGS. 10-12, the source-drain metal film is patterned by using a common mask in the third patterning process to form a pattern containing source electrodes 8, drain electrodes 9, data lines 10 and TFT channels. One end of each source electrode 8 is located on the active layer, and the other end is connected with the data line 10. One end of each drain electrode 9 is located on the active layer. The doped semiconductor layer 7 between the source electrode 8 and the drain electrode 9 is completely etched off. Part of the semiconductor layer 6 is etched off to expose the semiconductor layer 6 and form the pattern of the TFT channel.

Figure 13:
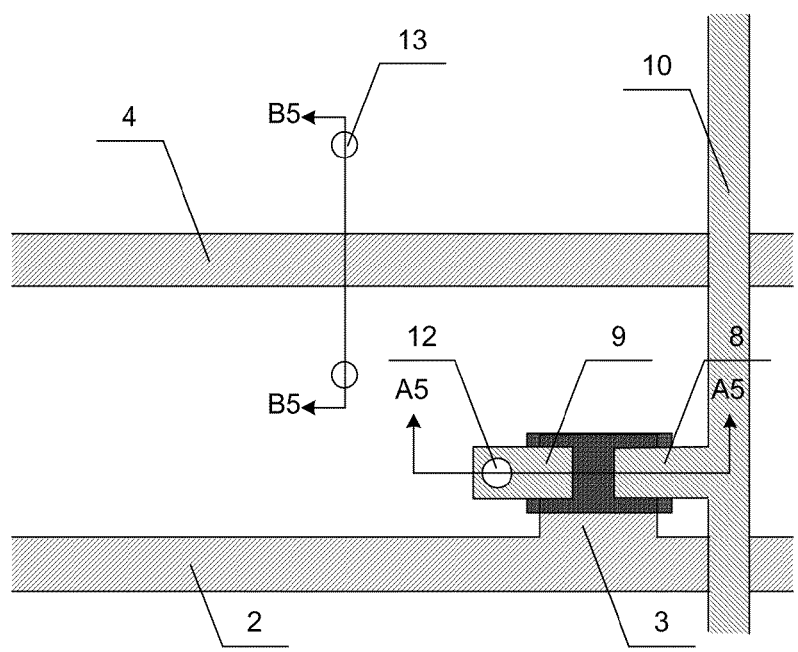
FIG. 13 is a flat view illustrating the array substrate of an LCD with a wide viewing angle after undergoing the fourth patterning process in accordance with the present invention.
Figure 14:
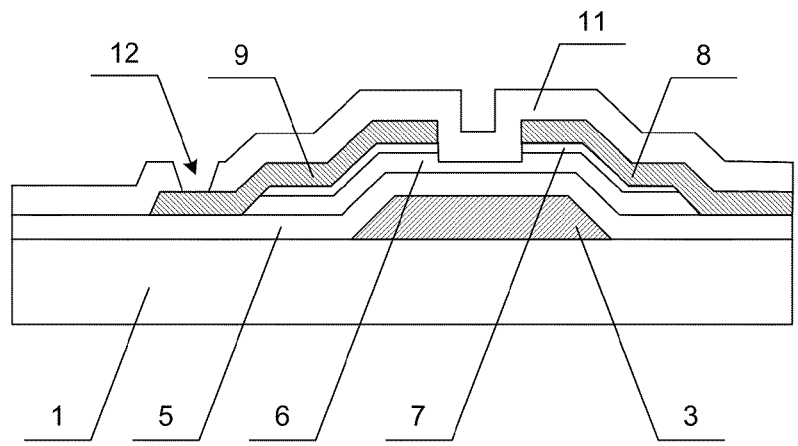
FIG. 14 is a cross-section view along the direction of A5-A5 in FIG. 13.
Figure 15:
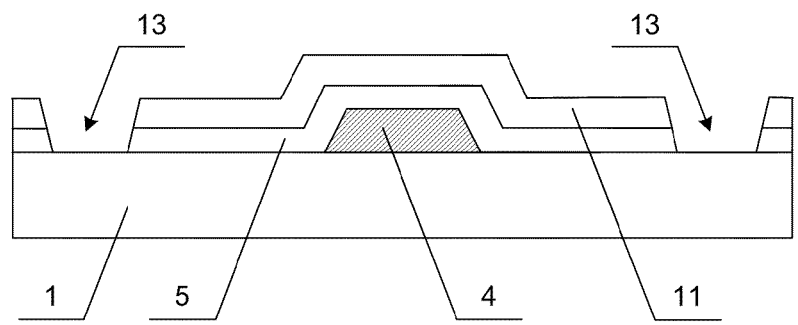
FIG. 15 is a cross-section view along the direction of B5-B5 in FIG. 13.

FIG. 13 is a flat view illustrating the array substrate of an LCD with a wide viewing angle after undergoing the fourth patterning process in accordance with the present invention. FIG. 14 is a cross-section view along the direction of A5-A5 in FIG. 13. FIG. 15 is a cross-section view along the direction of B5-B5 in FIG. 13. A layer of a passivation layer 11 may be deposited on the substrate by using a method of PECVD after finishing the above patterning. The passivation layer 11 may use SiNx, organic insulating material, or a laminated structure of the SiNx and the organic insulating material. The total thickness of the gate insulating layer and the passivation layer is 0.5 µm-5 µm, which is greater than or equal to the total thickness of the gate insulating layer and the passivation layer of the existing TN-type or MVA-type TFT-LCD. As shown in FIGS. 13-15, the passivation layer is patterned by using a common mask in the fourth patterning process to form a pattern containing a first via hole 12 and at least one second via hole 13 based on the condition that passivation layer covers the TFT channel. The first via hole 12 is located at the drain electrode 9. The passivation layer 11 in the first via hole 12 is completely etched off to expose the upper surface of the drain electrode 9. Each second via hole 13 is located within each pixel area. The passivation layer 11 and the gate insulating layer 5 in each second via hole 13 is completely etched off to expose the upper surface of the substrate 1. There may be one or more second via holes 13. The top view shape of each second via hole 13 may be of square, rectangle, polygon, round, oval, strip, or other shapes commonly used by people skilled in this art. The sidewall of each second via hole 13 is slope-shaped. An angle between the sidewall and the horizontal plane is 15°-85°. In each structure shown in FIGS. 13-15, the second via holes 13 are two round holes which are respectively located at two sides of the common electrode line 4, that is, they are located between the gate lines 2 and the common electrode line 4. In this patterning process, a pattern of a gate line pad area, a data line pad area and a common electrode line pad area is further formed. The gate line pad area, the data line pad area and the common electrode line pad area are located at the surrounding area of the display screen, which are adapted to be connected with corresponding driving circuits. The related structures have been widely used in the field of LCD manufacturing, which are well-known for people skilled in this art.

Finally, a layer of transparent conductive film is deposited on the substrate by using a method of magnetron sputtering or thermal evaporation after finishing the above patterning. As shown in FIGS. 1-3, the transparent conductive film is patterned by using a common mask in the fifth patterning process to form a pattern containing a pixel electrode 14 within each pixel area. Each pixel electrode 14 is connected to the drain electrode 9 via the first via hole 12. At the same time, each pixel electrode 14 covers each second via hole 13, and shafts 15 with slope-shaped sidewall are formed within each pixel area. Similar to the structure parameters of each second via hole 13, there may be one or more shafts 15. The top view shape of each shaft 15 may be of square, rectangle, polygon, round, oval, strip, or other shapes commonly used by people skilled in this art. An angle between the sidewall of the shaft 15 and the horizontal plane is 15°-85° to form a funnel-shaped structure with a smaller bottom area and a larger top area.

The above-mentioned 5-times patterning process is only one implementing means for manufacturing the array substrate of an LCD with a wide viewing angle in accordance with the present invention. Different times of patterning process and different material or material combinations can be used to implement the present invention. For example, the array substrate of an LCD with a wide viewing angle in accordance with the present invention may also be manufactured by 4-times patterning process, that is, the above-mentioned second patterning process and the above-mentioned third patterning process may be combined as one patterning process using a half tone mask or a grey tone mask.

Figure 16:
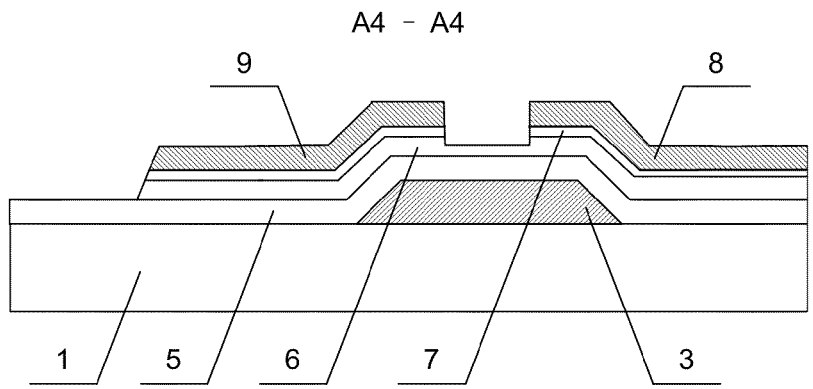
FIG. 16 is a structural schematic view illustrating the array substrate of an LCD with a wide viewing angle after undergoing the patterning process using a half tone mask or a grey tone mask in accordance with the present invention.

FIG. 16 is a structural schematic view illustrating the array substrate of an LCD with a wide viewing angle after undergoing the patterning process using a half tone mask or a grey tone mask in accordance with the present invention, which is a cross-section view along the direction of A4-A4 in FIG. 10. The patterning process using a half tone mask or a grey tone mask is a patterning process by combining the above-mentioned second patterning process and the above-mentioned third patterning process. The specific procedure includes: depositing a gate insulating layer, a semiconductor layer and a doped semiconductor layer in sequence on the structure after finishing the above-mentioned patterning by using a method of PECVD, depositing a source-drain metal film by using a method of magnetron sputtering or thermal evaporation, coating a layer of photoresist, exposing by using a half tone mask or a grey tone mask to make the photoresist form a completely exposed area (i.e., an area where the photoresist is completely removed), a partially exposed area (i.e., an area where the photoresist is partially removed), and an unexposed area (i.e., an area where the photoresist is completely remained). The unexposed area is corresponding to the area where the pattern of data lines, source electrodes and drain electrodes is located. The partially exposed area is corresponding to the area where the pattern of TFT channels is located. The completely exposed area is corresponding to the other area where the above pattern is not located. After developing, the thickness of the photoresist at the unexposed area does not change, the thickness of the photoresist at the partially exposed area becomes thinner, and the photoresist at the completely exposed area is completely removed. As shown in FIG. 16, the specific procedure further includes: etching the completely exposed area for the first time to etch off the source-drain metal film, the doped semiconductor layer and the semiconductor layer at the completely exposed area respectively so as to form the pattern of the active layer, the data lines, the drain electrodes and the source electrodes, performing ashing processing to completely remove the photoresist at the partially exposed area, and etching the partially exposed area for the second time to etch off the source-drain metal film and the doped semiconductor layer at the partially exposed area respectively and partially etched off the semiconductor layer so as to expose the area of the semiconductor layer and form the pattern of TFT channels. After undergoing this patterning process, the gate insulating layer covers the whole substrate. The semiconductor layer and the doped semiconductor layer located at the area other than the pattern of the active layers are completely etched off but the semiconductor layer and the doped semiconductor layer under the pattern of the data lines, source electrodes and the drain electrodes are remained. This procedure has been widely used in the field of LCD manufacturing.

Figure 17:
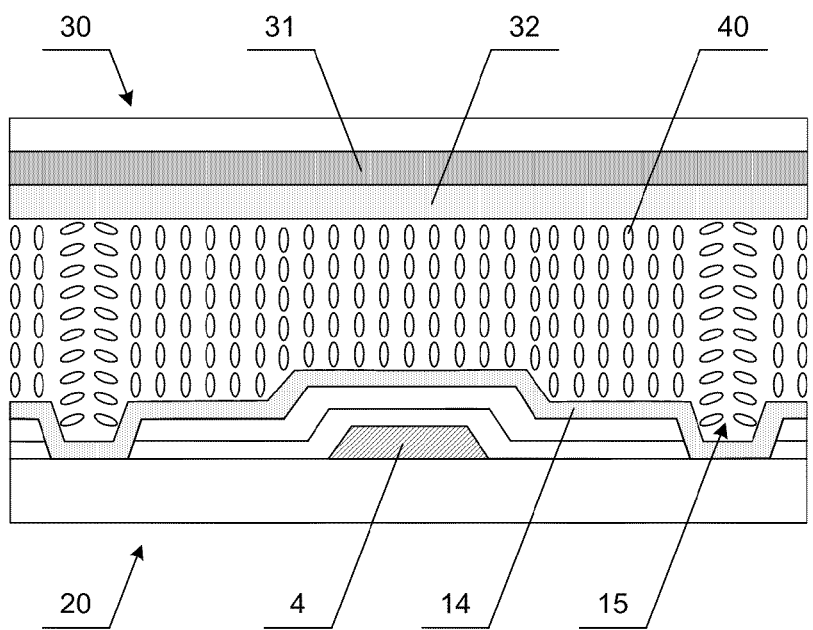
FIG. 17 is a schematic view illustrating the working principle of the array substrate of an LCD with a wide viewing angle in accordance with the present invention.

FIG. 17 is a schematic view illustrating the working principle of the array substrate of an LCD with a wide viewing angle in accordance with the present invention. As shown in FIG. 17, during practical implementing, an array substrate 20 and a color substrate 30 are disposed as a cell to form an LCD with a wide viewing angle. Liquid crystal 40 is disposed between the array substrate 20 and the color substrate 30. The array substrate 20 uses the structure of the above-mentioned array substrate of an LCD with a wide viewing angle in accordance with the present invention, which at least includes common electrode lines 4 and pixel electrodes 14 formed on the substrate. Shafts 15 with slope-shaped sidewalls are formed at two sides of each common electrode line 4. The color substrate 30 may uses a conventional structure, which at least includes color filter layers 31 and a common electrode 32 formed on the substrate. The liquid crystal 40 uses material with negative permittivity. Under a status of power off, the liquid crystal 40 outside the area of shafts 15 is aligned vertically under the effect of alignment material. All the long axes of the liquid crystal are perpendicular to the substrate. The liquid crystal 40 within each shaft 15 is aligned by means of slope. All the long axes of the liquid crystal are perpendicular to the sidewall of each shaft 15 so that an alignment defect (which is also usually called liquid crystal disclination in the technical field of LCD) happens in each shaft 15. The liquid crystal disclination refers to phenomena that the alignment of liquid crystal molecules is discontinuous. Taking the liquid crystal disclination as a division line, the alignment of the liquid crystal molecules at two sides of the division line different significantly. Under a status of power on, as each shaft in accordance with the present invention has a structure of a smaller bottom area and a larger top area, the alignment of the liquid crystal within the area of each shaft 15 induces the liquid crystal at surrounding area to form a multi-domain structure so as to improve the viewing angle to a maximum extent and the viewing angle is symmetric. At this time, the electric field applied on the liquid crystal is an electric field between the pixel electrodes 14 of the array substrate 20 and the common electrode 32 of the color substrate 30. Besides, the viewing angle may be further broadened by using a negative birefringence compensation film on the LCD with the wide viewing angle.

The above-mentioned array substrate of an LCD with a wide viewing angle in accordance with the present invention is only one implementing structure; there may be many structure variations in practical application. For example, the array substrate in the above embodiments uses a pixel structure that the storage capacitor is located on a common electrode line (Cs on Common) and the shafts in accordance with the present invention are disposed at two sides of the common electrode line. For a pixel structure with no common electrode line, i.e. a pixel structure that the storage capacitor is located on a gate line (Cs on Gate), the shafts in accordance with the present invention may be disposed in the middle of each pixel area or disposed within each pixel area evenly or symmetrically, which can also realize the characteristics of wide viewing angle and symmetric viewing angle.

Figure 18:
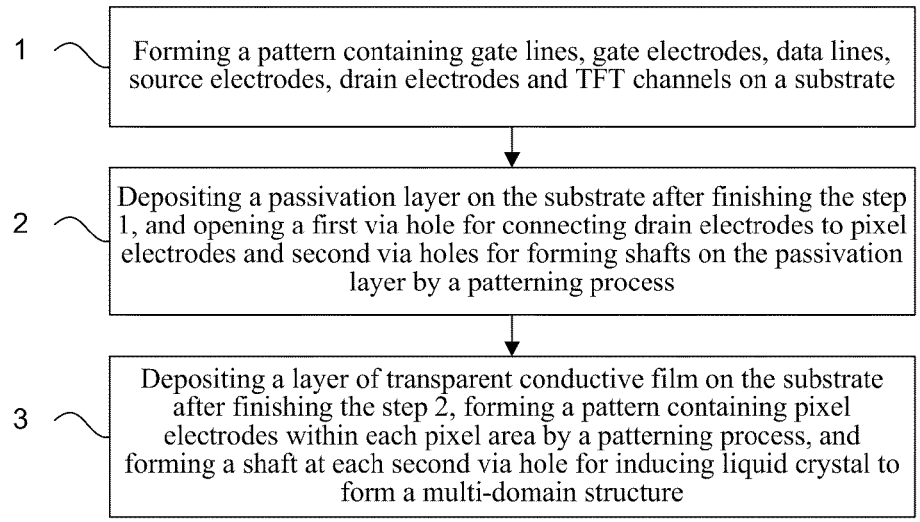
FIG. 18 is a flowchart illustrating the method for manufacturing the array substrate of an LCD with a wide viewing angle in accordance with the present invention.

FIG. 18 is a flowchart illustrating the method for manufacturing the array substrate of an LCD with a wide viewing angle in accordance with the present invention. The method specifically includes the following steps.

Step 1, forming a pattern containing gate lines, gate electrodes, data lines, source electrodes, drain electrodes and TFT channels on a substrate;

Step 2, depositing a passivation layer on the substrate after finishing the step 1, and opening a first via hole for connecting each drain electrode to each pixel electrode and a second via hole for forming a shaft on the passivation layer by a patterning process;

Step 3, depositing a layer of transparent conductive film on the substrate after finishing the step 2, forming a pattern containing the pixel electrode within each pixel area by a patterning process, and forming a shaft at each second via hole for inducing liquid crystal to form a multi-domain structure.

The technical solution of the method for manufacturing the array substrate of an LCD with a wide viewing angle in accordance with the present invention will be further explained by the following specific embodiments.

Figure 19:
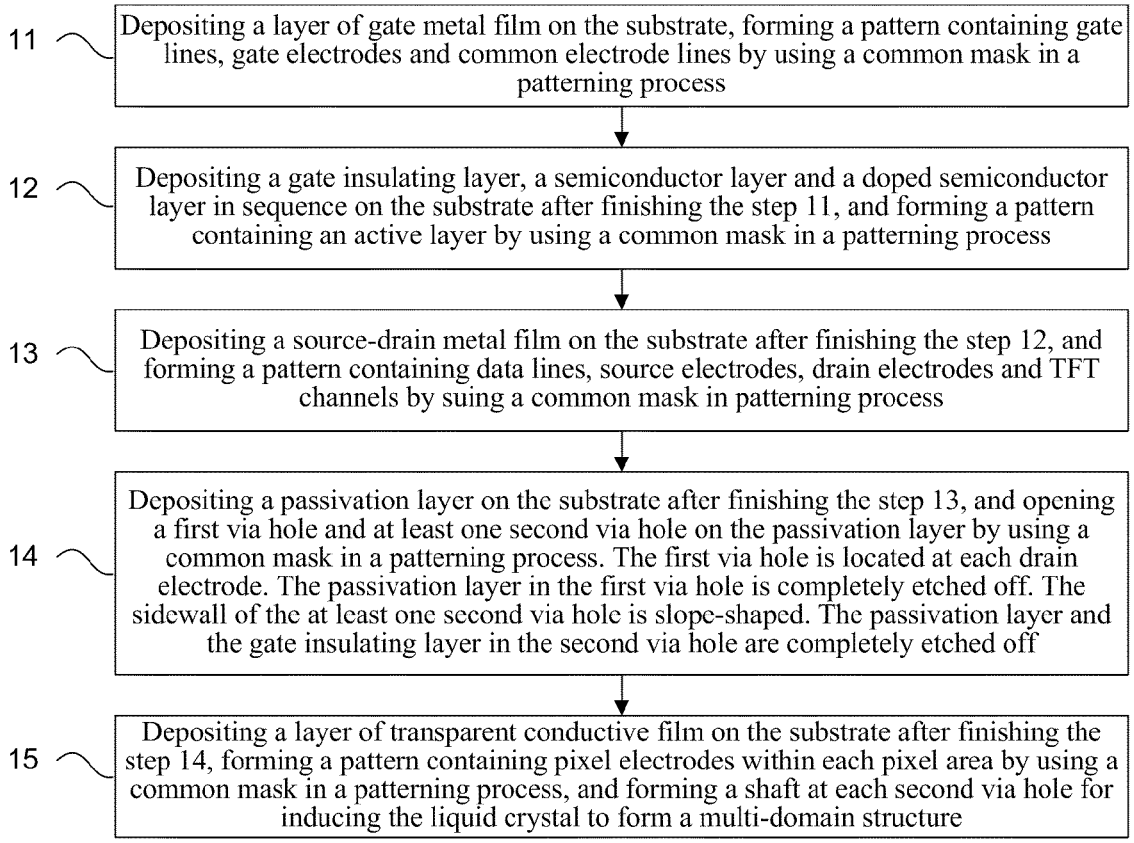
FIG. 19 is a flowchart illustrating the first embodiment of the method for manufacturing the array substrate of an LCD with a wide viewing angle in accordance with the present invention.

FIG. 19 is a flowchart illustrating the first embodiment of the method for manufacturing the array substrate of an LCD with a wide viewing angle in accordance with the present invention. The method specifically includes the following steps:

Step 11, depositing a layer of gate metal film on a substrate, forming a pattern containing gate lines, gate electrodes and common electrode lines by using a common mask in a patterning process;

Step 12, depositing a gate insulating layer, a semiconductor layer and a doped semiconductor layer in sequence on the substrate after finishing the step 11, and forming a pattern containing an active layer by using a common mask in a patterning process;

Step 13, depositing a source-drain metal film on the substrate after finishing the step 12, and forming a pattern containing data lines, source electrodes, drain electrodes and TFT channels by using a common mask in a patterning process;

Step 14, depositing a passivation layer on the substrate after finishing the step 13, and opening a first via hole and at least one second via hole on the passivation layer by using a common mask in a patterning process. The first via hole is located at each drain electrode. The passivation layer in the first via hole is completely etched off. The sidewall of the at least one second via hole is slope-shaped. The passivation layer and the gate insulating layer in the second via hole are completely etched off;

Step 15, depositing a layer of transparent conductive film on the substrate after finishing the step 14, forming a pattern containing a pixel electrode within each pixel area by using a common mask in a patterning process, and forming a shaft at each second via hole for inducing liquid crystal to form a multi-domain structure.

In step 11, the patterning process is depositing a layer of gate metal film on the substrate (such as a glass substrate or a quartz substrate) by using a method of magnetron sputtering or thermal evaporation, patterning the gate metal film by using a common mask in a patterning process, and forming a pattern containing the gate lines and the gate electrodes on a certain area of the substrate. In practical implementation, the common electrode lines may be formed in the patterning process at the same time. Each common electrode line is located between two adjacent gate lines, parallel to the gate lines and located in the middle of each pixel area, which is adapted to form a storage capacitor together with each pixel electrode so as to form a structure that the storage capacitor is located on each common electrode line (Cs on Common).

In step 12, after finishing the above patterning, depositing the gate insulating layer (which may use SiNx, SiOx or SiOxNy), the semiconductor layer and the doped semiconductor layer (ohmic contact layer) in sequence on the substrate by using a method of PECVD, patterning the semiconductor layer and the doped semiconductor layer by using a common mask in a patterning process, and forming a pattern containing the active layer over the gate electrode. The active layer contains the semiconductor layer and the doped semiconductor layer.

In step 13, after finishing the above patterning, depositing a layer of the source-drain metal film on the substrate by using a method of magnetron sputtering or thermal evaporation, patterning the source-drain metal film by using a common mask in a patterning process, and forming the pattern containing the source electrodes, the drain electrodes, the data lines and the TFT channels. One end of each source electrode is located on the active layer, and the other end is connected with each data line. One end of each drain electrode is located on the active layer. The doped semiconductor layer between source electrodes and drain electrodes is completely etched off. Part of the semiconductor layer is etched off to expose the semiconductor layer so as to form a pattern of the TFT channels.

In step 14, after finishing the above patterning, depositing a passivation layer on the substrate by using a method of PECVD. The passivation layer may use SiNx, organic insulating material or a laminated structure of the SiNx and the organic insulating material. The total thickness of the gate insulating layer and the passivation layer is 0.5 μm-5 μm, which is greater than or equal to the total thickness of the gate insulating layer and the passivation layer of the existing TN-type or MVA-type TFT-LCD. The step 14 is also to pattern the passivation layer by using a common mask in a patterning process and form a pattern containing a first via hole and at least one second via hole based on the condition that the passivation layer covers each TFT channel. The first via hole is located at each drain electrode. The passivation layer within the first via hole is completely etched off to expose the top surface of each drain electrode. The at least one second via hole are located within each pixel area. The passivation layer and the gate insulating layer within each second via hole are completely etched off to expose the top surface of the substrate. There may be one or more second via holes. The top view shape of each second via hole may be of square, rectangle, polygon, round, oval, strip, or other shapes commonly used by people skilled in this art. Preferably, under a condition of area equally, the top view shape of each second via hole is a shape with longer circumference. The sidewall of each second via hole is slope-shaped. An angle between the sidewall of each shaft and the horizontal plane is 15°-85°. In this patterning process, a pattern of gate line pad area, data line pad area and common electrode line pad area is also formed. The gate line pad area, data line pad area and common electrode line pad area are located at surrounding area of the display screen, which are adapted to be connected with corresponding driving circuits. The related structures have been widely used in the field of LCD manufacturing, which are well-known for people skilled in this art.

In step 15, after finishing the above patterning, depositing a layer of the transparent conductive film on the substrate by using a method of magnetron sputtering or thermal evaporation, patterning the transparent conductive film by using a common mask in a patterning process, and forming a pattern containing the pixel electrode within each pixel area. Each pixel electrode is connected with each drain electrode via the first via hole, and covers the at least one second via hole at the same time, forming at least one shaft with slope-shaped sidewalls within each pixel area. Similar to the structure parameters of the at least one second via hole, there may be one or more shafts. The top view shape of each shaft may be of square, rectangle, polygon, round, oval, strip, or other shapes commonly used by people skilled in this art. Preferably, under a condition of area equally, the top view shape of each shaft is a shape with longer circumference. An angle between the sidewall of each shaft and the horizontal plane is 15°-85° so as to form a funnel-shaped structure with a smaller bottom area and a larger top area.

The array substrate formed in the present embodiment is a pixel structure that the storage capacitor is on each common electrode line (Cs on Common). If no common electrode line is formed in the step 11, each pixel electrode in the step 15 will be overlapped with part of each gate line so as to form the pixel structure that the storage capacitor is on each gate line (Cs on Gate). The at least one shaft may be disposed in the middle of each pixel area or evenly or symmetrically disposed within each pixel area, which can also make the array substrate of an LCD in accordance with the present invention realize the characteristics of wide viewing angle and symmetric viewing angle.

The structure and working principle of the array substrate of an LCD with a wide viewing angle formed in the present embodiment have been explained in detail as mentioned before. Under a status of power off, an alignment defect of liquid crystal at the area of each shaft happens. Under a status of power on, the alignment of the liquid crystal at the area of each shaft induces the liquid crystal at surrounding area to form a multi-domain structure.

Figure 20:
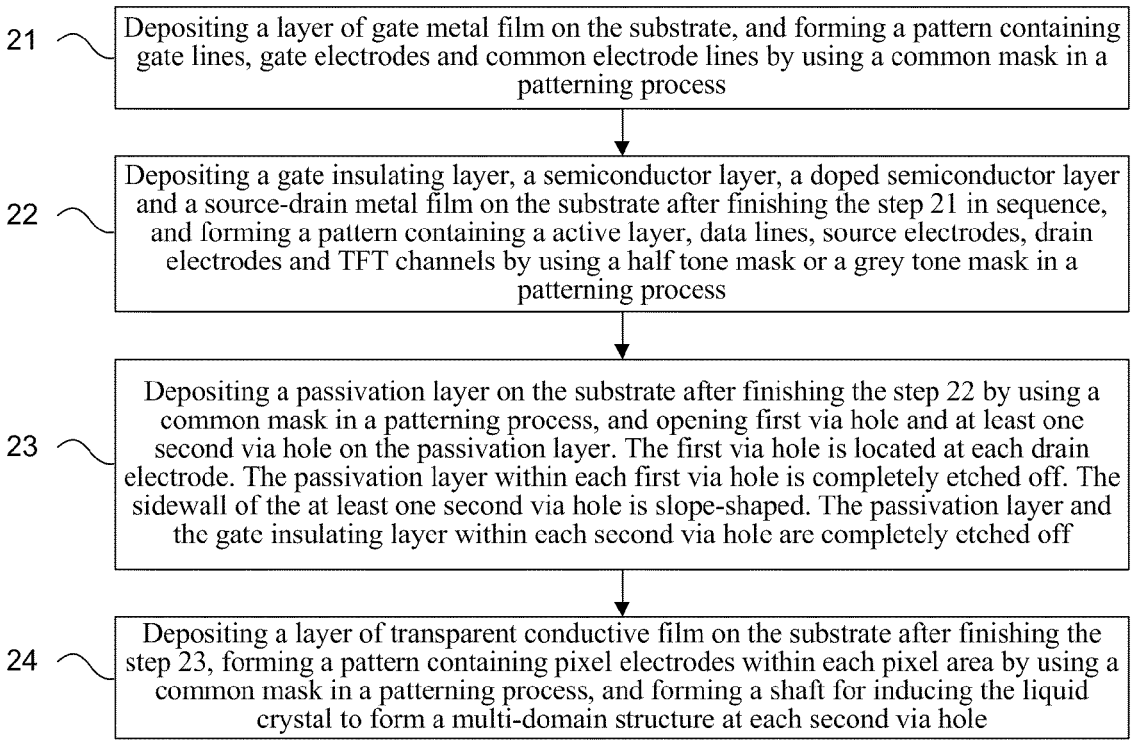
FIG. 20 is a flowchart illustrating the second embodiment of the method for manufacturing the array substrate of an LCD with a wide viewing angle in accordance with the present invention.

FIG. 20 is a flowchart illustrating the second embodiment of the method for manufacturing the array substrate of an LCD with a wide viewing angle in accordance with the present invention. The method specifically includes the following steps.

Step 21, depositing a layer of gate metal film on a substrate, and forming a pattern containing gate lines, gate electrodes and common electrode lines by using a common mask in a patterning process;

Step 22, depositing a gate insulating layer, a semiconductor layer, a doped semiconductor layer and a source-drain metal film in sequence on the substrate after finishing the step 21, and forming a pattern containing a active layer, data lines, source electrodes, drain electrodes and TFT channels by using a half tone mask or a grey tone mask in a patterning process;

Step 23, depositing a passivation layer on the substrate after finishing the step 22, and opening a first via hole and at least one second via hole on the passivation layer by using a common mask in a patterning process. The first via hole is located at each drain electrode. The passivation layer within each first via hole is completely etched off. The sidewall of the at least one second via hole is slope-shaped. The passivation layer and the gate insulating layer within each second via hole are completely etched off;

Step 24, depositing a layer of transparent conductive film on the substrate after finishing the step 23, forming a pattern containing a pixel electrode within each pixel area by using a common mask in a patterning process, and forming a shaft for inducing liquid crystal to form a multi-domain structure at each second via hole.

The main flow in the present embodiment is basically the same as that in the first embodiment and with difference that the step 12 and the step 13 in the first embodiment are combined as one patterning process using a half tone mask or a grey tone mask. Other procedures are the same as those in the above first embodiment.

The specific procedure of the patterning process using a half tone mask or a grey tone mask specifically includes: depositing a gate insulating layer, a semiconductor layer and a doped semiconductor layer on the substrate after finishing the patterning in sequence by using a method of PECVD, depositing a source-drain metal film by using a method of magnetron sputtering or thermal evaporation, coating a layer of photoresist, exposing by using a half tone or a grey tone mask to make the photoresist form a completely exposed area (i.e., an area where the photoresist is completely removed), a partially exposed area (i.e., an area where the photoresist is partially removed), and an unexposed area (i.e., an area where the photoresist is completely remained). The unexposed area is corresponding to the area where the pattern of data lines, source electrodes and drain electrodes is located. The partially exposed area is corresponding to the area where the pattern of TFT channels is located. The completely exposed area is corresponding to the other area where the above pattern is not located. After developing, the thickness of the photoresist at the unexposed area does not change, the thickness of the photoresist at the partially exposed area becomes thinner, and the photoresist at the completely exposed area is completely removed. The specific procedure further includes: etching the completely exposed area for the first time to etch off the source-drain metal film, the doped semiconductor layer and the semiconductor layer at the completely exposed area respectively so as to form the pattern of the active layer, the data lines, the drain electrodes and the source electrodes, performing ashing processing to completely remove the photoresist at the partially exposed area, and etching the partially exposed area for the second time to etch off the source-drain metal film and the doped semiconductor layer at the partially exposed area respectively and partially etched off the semiconductor layer so as to expose the area of the semiconductor layer and form the pattern of TFT channels. After undergoing this patterning process, the gate insulating layer covers the whole substrate. The semiconductor layer and the doped semiconductor layer located at the area other than the pattern of the active layers are completely etched off but the semiconductor layer and the doped semiconductor layer under the pattern of the data lines, source electrodes and the drain electrodes are remained. This procedure has been widely used in the field of LCD manufacturing.

The present invention provides a method for manufacturing an array substrate of an LCD with a wide viewing angle. At least one shaft with slope-shaped sidewall is formed within each pixel area, which induces liquid crystal to form a multi-domain structure so as to realize a display mode of novel multi-domain vertical alignment. The display mode uses negative liquid crystal. Under the status of power off, the liquid crystal outside the area of each shaft is aligned vertically under the effect of alignment material while an alignment defect happens at the area of each shaft. Under the status of power on, the alignment of the liquid crystal at the area of each shaft induces the liquid crystal at surrounding area to form a multi-domain structure so as to realize a wide viewing angle which is also symmetric. Furthermore, on the precondition of ensuring the characteristics of the wide viewing angle, as the technical solution of the present invention needs neither a convex structure at the color substrate side nor a rubbing process, the present invention simplifies the structure and the manufacturing process of the array substrate, and the manufacturing process can be compatible with that of a conventional TN-type TFT-LCD. During practical application, the viewing angle may be further broadened by using a negative birefringence compensation film inside of a polarizer. The array substrate of an LCD with a wide viewing angle in accordance with the present invention may be used in an LCD in various driving modes such as frame inversion, line inversion, column inversion, and point inversion so as to have a widespread application prospect.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the scope of the present invention.

What is claimed is:

1. An array substrate of an LCD with a wide viewing angle, comprising gate lines and data lines formed on a substrate, and thin film transistors (TFTs) and pixel electrodes formed in pixel areas defined by the gate lines and the data lines, wherein at least one shaft for inducing liquid crystal to form a multi-domain structure is formed on each of the pixel electrodes;
   wherein each of the TFTs comprises a gate electrode, a gate insulating layer, a semiconductor layer, a doped semiconductor layer, a source electrode, a drain electrode, a TFT channel and a passivation layer; the passivation layer is formed on the source electrode, the drain electrode and the TFT channel; and a first via hole for connecting each of the pixel electrodes to the drain electrode and a second via hole with a slope-shaped sidewall to form the shaft are opened on the passivation layer; and
   wherein the passivation layer and the gate insulating layer within the second via hole are completely etched off, each of the pixel electrodes covers the second via hole to form a funnel-shaped shaft with a smaller bottom area and a larger top area and for inducing the liquid crystal to form the multi-domain structure.

2. The array substrate according to claim 1, wherein a top view shape of the shaft is of square, rectangle, polygon, round, oval, or strip.

3. The array substrate according to claim 1, wherein a top view shape of the shaft is of square, rectangle, polygon, round, oval, or strip.

4. The array substrate according to claim 1, wherein a top view shape of the shaft is of square, rectangle, polygon, round, oval, or strip.

5. The array substrate according to claim 1, wherein an angle between the sidewall of the shaft and a horizontal plane is 15°-85°.

6. The array substrate according to claim 1, wherein an angle between the sidewall of the shaft and a horizontal plane is 15°-85°.

7. The array substrate according to claim 1, wherein an angle between the sidewall of the shaft and a horizontal plane is 15°-85°.

8. A method for manufacturing an array substrate of an LCD with a wide viewing angle, comprising:
   step 1, forming a pattern containing gate lines, gate electrodes, data lines, source electrodes, drain electrodes and thin film transistor (TFT) channels on a substrate;
   step 2, depositing a passivation layer on the substrate after finishing the step 1, and opening a first via hole for connecting each of the drain electrodes to each of pixel electrodes and a second via hole for forming a shaft by a patterning process on the passivation layer; and
   step 3, depositing a layer of a transparent conductive film on the substrate after finishing the step 2, forming a pattern containing the pixel electrodes by a patterning process within pixel areas, and forming a shaft at the second via hole for inducing liquid crystal to form a multi-domain structure;
   wherein the step 2 specifically comprises: depositing the passivation layer on the substrate after finishing the step 1, opening the first via hole and at least one second via hole on the passivation layer by using a common mask in a patterning process; and the first via hole is located at each of the drain electrodes, the passivation layer within the first via hole is completely etched off, a sidewall of the at least one second via hole is slope-shaped, and the passivation layer and the gate insulating layer within the second via hole are completely etched off.

9. The method according to claim 8, wherein a top view shape of the second via hole is of square, rectangle, polygon, round, oval, or strip.

10. The method according to claim 8, wherein a top view shape of the second via hole is of square, rectangle, polygon, round, oval, or strip.

11. The method according to claim 8, wherein an angle between the sidewall of the second via hole and a horizontal plane is 15°-85°.

12. The method according to claim 8, wherein an angle between the sidewall of the second via hole and a horizontal plane is 15°-85°.

* * * * *